(12) United States Patent
Zevenbergen

(10) Patent No.: US 12,216,463 B2
(45) Date of Patent: Feb. 4, 2025

(54) DESTRUCTION VALIDATION SYSTEM

(71) Applicant: Google LLC, Mountain View, CA (US)

(72) Inventor: John Zevenbergen, Woodway, WA (US)

(73) Assignee: Google LLC, Mountain View, CA (US)

( * ) Notice: Subject to any disclaimer, the term of this patent is extended or adjusted under 35 U.S.C. 154(b) by 1108 days.

(21) Appl. No.: 16/682,418

(22) Filed: Nov. 13, 2019

(65) Prior Publication Data

US 2021/0138481 A1 May 13, 2021

(51) Int. Cl.
| | |
|---|---|
| G05B 23/02 | (2006.01) |
| B02C 18/00 | (2006.01) |
| B02C 25/00 | (2006.01) |
| G01R 19/00 | (2006.01) |
| G01R 19/165 | (2006.01) |

(52) U.S. Cl.
CPC ...... *G05B 23/0235* (2013.01); *B02C 18/0007* (2013.01); *B02C 25/00* (2013.01); *G01R 19/0092* (2013.01); *G01R 19/165* (2013.01); *B02C 2018/0015* (2013.01); *G05B 23/02* (2013.01); *G05B 2219/24039* (2013.01)

(58) Field of Classification Search
CPC ............. G01R 19/165; G01R 19/0092; B02C 18/0007; B02C 25/00; B02C 2018/0015; G05B 23/02; G05B 23/0235; G05B 2219/24039; G06F 21/78
USPC ........................................................ 340/664
See application file for complete search history.

(56) References Cited

U.S. PATENT DOCUMENTS 8,364,306 B2 * 1/2013 Rodriguez ............ G06F 11/006 222/65
8,533,045 B1 * 9/2013 Cunningham ..... G06Q 30/0207 705/14.47

(Continued)

FOREIGN PATENT DOCUMENTS

CN 101011677 A 8/2007
CN 207637500 U 7/2018

(Continued)

OTHER PUBLICATIONS

Extended European Search Report for European Patent Application No. 20205907.7 dated Apr. 15, 2021. 8 pages.

(Continued)

*Primary Examiner* — Thienvu V Tran
*Assistant Examiner* — Sreeya Sreevatsa
(74) *Attorney, Agent, or Firm* — Lerner David LLP

(57) ABSTRACT

This technology relates to a destruction validation system. The destruction validation system includes a destruction device and a controller. The controller is configured to monitor current drawn by the destruction device during destruction of the piece of physical media. The controller may compare the current drawn to a current profile. Based on the comparison of the current drawn to the current profile, the controller may generate and output a notification indicating whether the piece of physical media has been destroyed. In some instances, the destruction device includes a current sensing device. The current sensing device may be configured to detect the current drawn by the destruction device and transmit the detected current drawn to the controller. The current drawn that is monitored by the controller may be the detected current drawn by the current sensing device.

18 Claims, 10 Drawing Sheets

(56) References Cited

U.S. PATENT DOCUMENTS

| | | | |
|---|---|---|---|
| 9,430,654 B1 | | 8/2016 | Rajaie |
| 9,633,494 B1 | | 4/2017 | Sun et al. |
| 10,657,345 B1 | * | 5/2020 | Ebadian .................. B02C 25/00 |
| 10,675,635 B1 | * | 6/2020 | Drexler ................... B02C 25/00 |
| 2003/0146275 A1 | * | 8/2003 | Bennett ................... G07F 7/086 |
| | | | 235/376 |
| 2009/0267740 A1 | | 10/2009 | Pizzuto |
| 2016/0303575 A1 | * | 10/2016 | Smith ..................... G06F 21/32 |

FOREIGN PATENT DOCUMENTS

| | | | | |
|---|---|---|---|---|
| DE | 4437351 A1 | * | 4/1996 | ............. H02H 7/085 |
| EP | 1192999 A1 | * | 4/2002 | ......... B02C 18/0007 |
| JP | 6220604 B2 | * | 10/2017 | |
| WO | WO-2019075530 A1 | * | 4/2019 | ............. B02C 18/00 |

OTHER PUBLICATIONS

Office Action for European Patent Application No. 20205907.7 dated Jun. 12, 2023. 5 pages.

Office Action for Chinese Patent Application No. 202011269734.1 dated Nov. 14, 2023. 9 pages.

Office Action for European Patent Application No. 20205907.7 datd May 24, 2024. 6 pages.

\* cited by examiner

DESTRUCTION VALIDATION SYSTEM

BACKGROUND

Physical media that is no longer in service or no longer needed often has data stored thereon erased. Erasing the data may remove the data from the hard drive, but the data could be recreated with specialized tools. To prevent data on the media from being retrieved or recreated, the physical media may be destroyed. Destruction of the physical media may make the data stored on the physical media inaccessible and incapable of being recreated. For physical media that stores sensitive data, it may be necessary to provide assurances that the physical media and the data on the physical media are destroyed.

SUMMARY

This technology relates to a destruction validation system for assuring destruction of a piece of physical media. The destruction validation system may comprise a destruction device and a controller. The controller may be configured to monitor current drawn by the destruction device during destruction of a piece of physical media, compare the monitored current to a current profile, and generate and output a notification indicating whether the piece of physical media has been destroyed based on the comparison of the monitored current to the current profile.

In some instances, the destruction device comprises one or more of a shredding machine, a punching machine, or a crushing machine.

In some instances, the destruction device includes a current sensing device. The current sensing device may be configured to detect the current drawn by the destruction device, and transmit the detected current drawn to the controller, wherein the monitored current is the detected current drawn.

In some instances, the notification is further based one or more of a start time or an end time of the destruction of the piece of physical media. In some examples, the notification indicates the piece of physical media has been destroyed when the monitored current matches the current profile and the start time and/or the end time of the destruction of the piece of physical media is within a predetermined time period.

In some instances, the notification indicates the piece of physical media has been destroyed when the current drawn matches the current profile.

In some instances, the current profile includes a current spike value. In some examples, the current profile includes current values over a period of time. In some examples, the current profile corresponds to a type of the piece of physical media, wherein the type of the piece of physical media includes one or more of a hard drive, a solid state hard drive, a memory module, or a disc.

In some instances, the destruction validation system further includes a validation and tracking device including a platform and one or more imaging devices. In some examples, the destruction validation system further includes a plurality of chutes for transporting the piece of physical media. The plurality of chutes may include a first chute for transporting the piece of physical media to an exterior of the destruction validation system and a second chute for transporting the piece of physical media to the destruction device. In some examples, the platform includes a plurality of panels configured to direct the piece of physical media to one of the plurality of chutes.

In some instances, the controller is further configured to receive, from the one or more imaging devices, identification information of piece of physical media; compare the identification information of the piece of physical media to a destruction manifest; and determine, based on the comparison of the identification information to the destruction manifest, whether the piece of physical media is approved for destruction.

In some examples, the controller is further configured to: upon determining the identification information of the piece of physical media matches a listed device on the destruction manifest, controlling positions of the plurality of panel to direct the piece of physical media to the second chute.

In some examples, the controller is further configured to: upon determining the identification information of the piece of physical media does not match a listed device on the destruction manifest, controlling positions of the plurality of panels to direct the piece of physical media to the first chute.

In some instances, the destruction validation system further includes a display device, wherein the notification is displayed on the display.

Another aspect of the disclosure is directed to a method for destroying a piece of physical media. The method may include monitoring, by a controller, current drawn by a destruction device during destruction of the piece of physical media; comparing, by the controller, the monitored current to a current profile; and generating and outputting, by the controller, a notification indicating whether the piece of physical media has been destroyed based on the comparison of the monitored current to the current profile. In some examples, the notification is further based one or more of a start time or an end time of the destruction of the piece of physical media, wherein the notification indicates the piece of physical media has been destroyed when the monitored current matches the current profile and the start time and/or the end time of the destruction of the piece of physical media is within a predetermined time period. In some examples, the notification indicates the piece of physical media has been destroyed when the monitored current matches the current profile. In some examples, the current profile includes a current spike value and/or current values over a period of time.

DETAILED DESCRIPTION

Figure 1A:
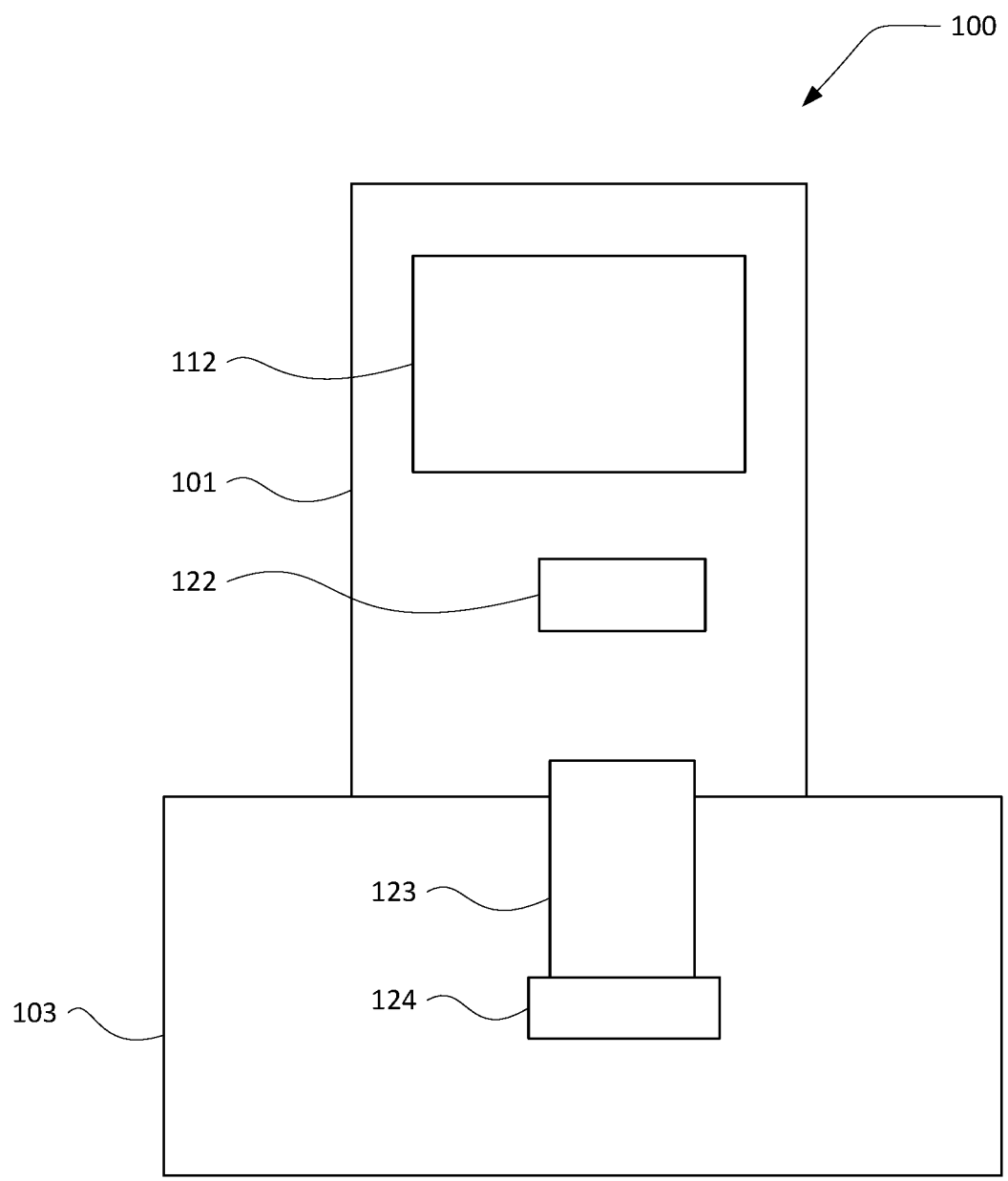
FIG. 1A shows a front view of a destruction validation system in accordance with aspects of the disclosure.
Figure 1B:
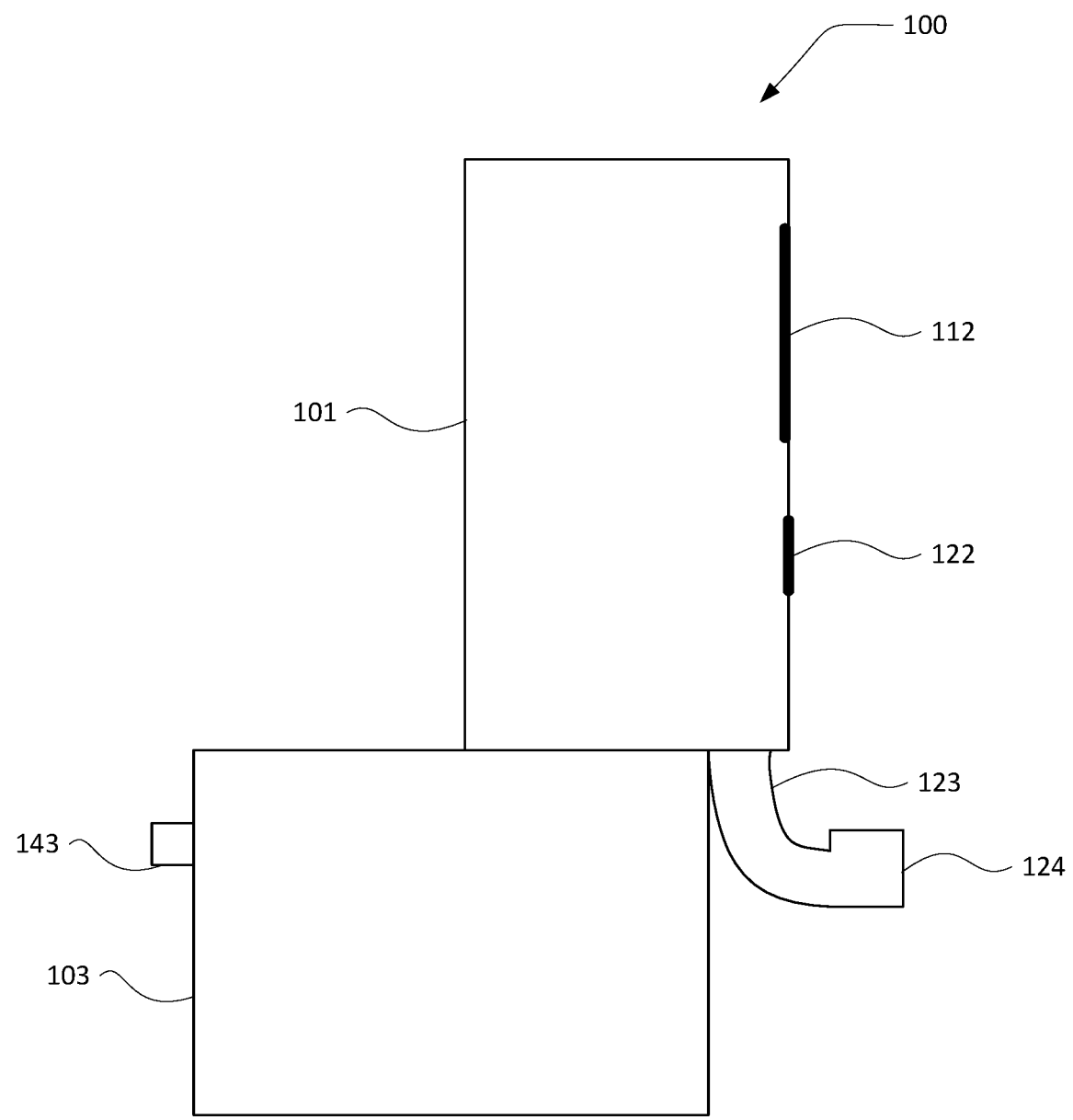
FIG. 1B shows a side view of a destruction validation system in accordance with aspects of the disclosure.

The technology relates generally to a destruction validation system 100 for tracking, performing, and validating the destruction of physical media, such as hard drives, solid state hard drives, compact discs, memory modules, etc. For example, and as illustrated in FIGS. 1A and 1B, the destruction validation system 100 may include a validation and tracking device 101 and a destruction device 103. A piece of physical media may be received by the validation and tracking device 101 at the insertion slot 122.

For each piece of physical media inserted into the insertion slot 122, the validation and tracking device 101 may determine whether the inserted piece of physical media is a piece of physical media that is supposed to be destroyed. In the event the inserted piece of physical media is not supposed to be destroyed, it may be rejected and ejected from the validation and tracking device 101 via the ejection chute 123 to the collection bin 124. In the event the inserted piece of physical media is approved for destruction, the piece of physical media may be logged by the validation and tracking device. In some instances, confirmation that the destruction of the piece of physical media may proceed may be requested via input device 112. The piece of physical media may be released to the destruction device 103 for destruction once approved by the validation and tracking device 101 and, if needed, confirmation is received at input device 112.

The validation and tracking device 101 may monitor the destruction device 103 to confirm the piece of physical media is destroyed. In this regard, the destruction device 103 may include a current sensing device 143, shown in FIG. 1B, that monitors the amount of current flowing through the destruction device 103. The validation and tracking device 101 may monitor the current provided by the current sensing device 143 for a current spike within a certain time period of releasing the piece of physical media to be destroyed. In this regard, during the destruction of a piece of physical media, the destruction device 103 may require more current to operate. The validation and tracking device 101 may confirm destruction of the piece of physical media when, within the time period, the validation and tracking device monitors a current spike that matches a current profile associated with the type of physical media being destroyed by the destruction device, described herein.

The validation and tracking device 101 may be configured to integrate with known destruction devices. In this regard, the validation and tracking device may be configured to mount or otherwise couple to the known destruction devices. In some instances, the validation and tracking device 101 may be configured to control the operation of the known destruction devices, such as initiating destruction of physical media, as described herein.

Many data centers, enterprises, companies, individuals, and other entities maintain data destruction policies that require physical media be destroyed after it is done being used. The purpose of these policies is generally to assure the data stored on the physical media is not retrieved or possibly recreated by a party that should not have access to it. Typical methods of destroying the physical media, including the use of disk shredders or other devices, require operators to manually track and log the destruction of the physical media. Manual tracking and logging may be prone to errors such as the destruction of the wrong piece of physical media or failure to complete the destruction of the piece of physical media. For example, an operator may log a piece of physical media being destroyed but forget to place the piece of physical media in the disk shredder. Such errors and failure of destruction may result in the loss of data if the wrong piece of physical media is shredded or allow access to physical media storing data by individuals who should not have access to that data. The destruction validation system 100 described herein provides automated logging and tracking of the destruction of physical media. Additionally, the system provides confirmation that the destruction of the physical media has occurred.

Figure 2:
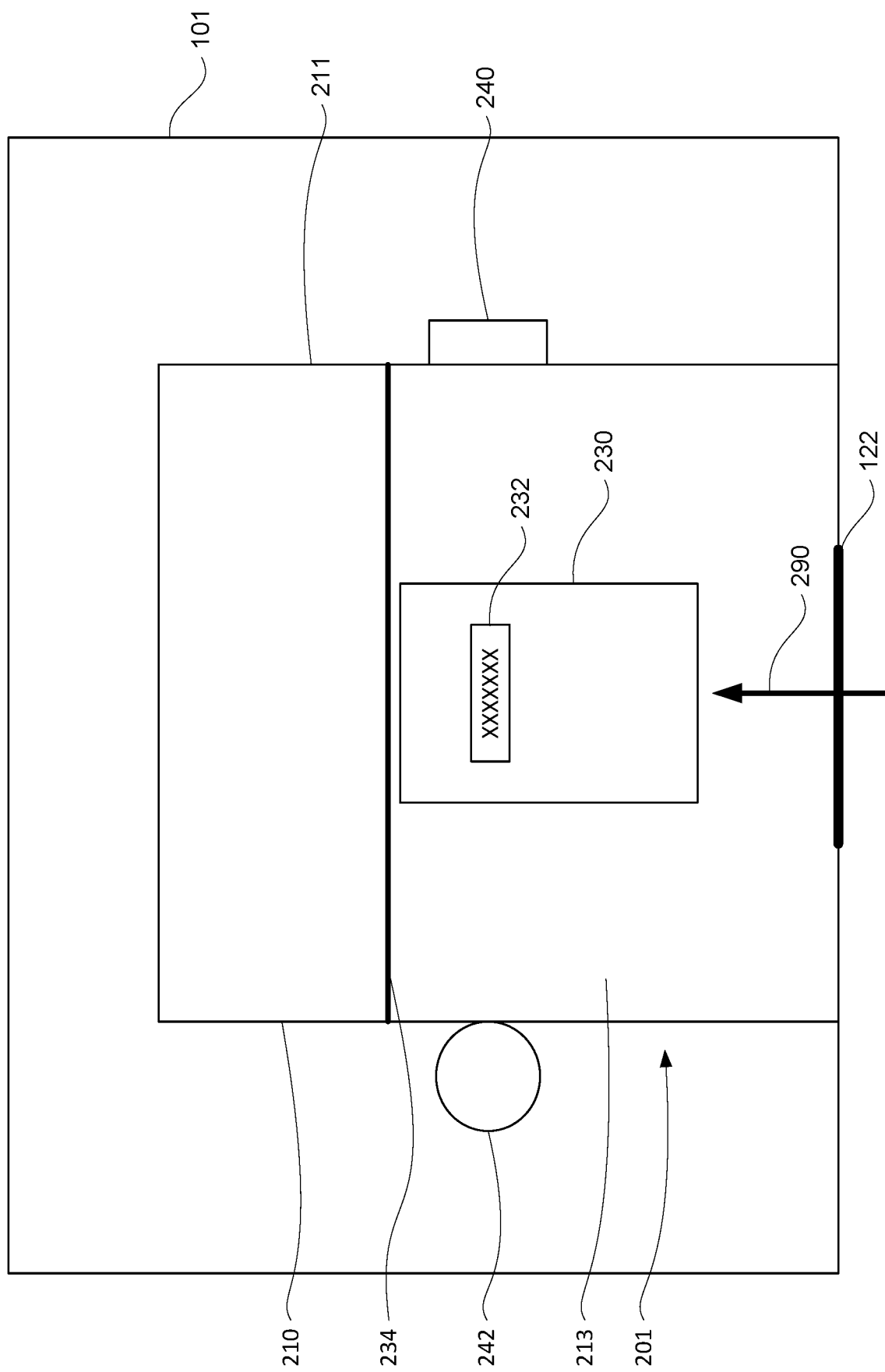
FIG. 2 shows a top-down view of a platform in a validation and tracking system in accordance with aspects of the disclosure.
Figure 3:
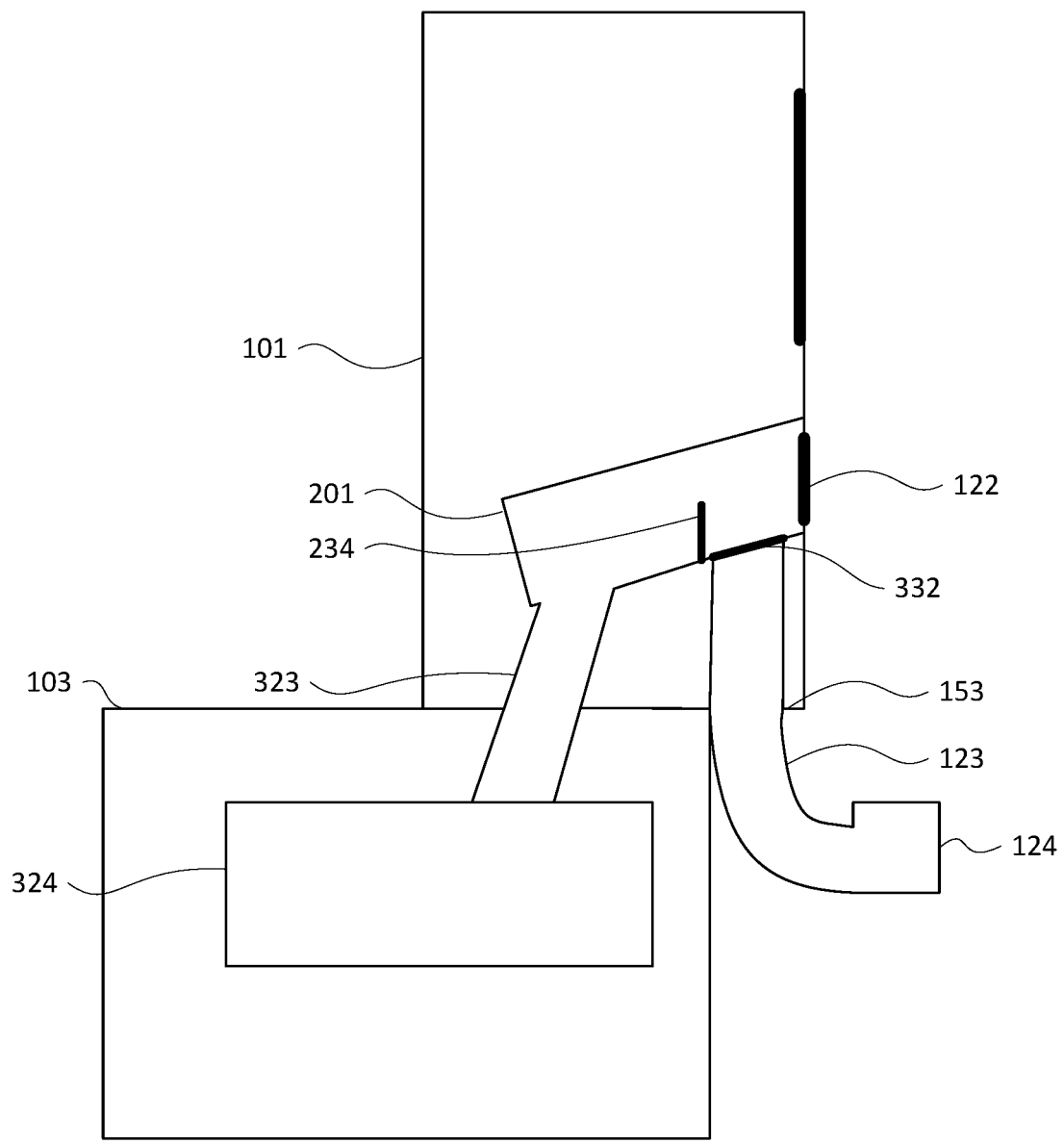
FIG. 3 shows a side cut-away view of a destruction validation system in accordance with aspects of the disclosure.

FIG. 2 shows a top-down view of the interior of the validation and tracking device 101. The interior of the validation and tracking device 101 includes a platform 201, imaging devices 240, 242, and a stopping panel 234. The platform 201 may be positioned adjacent the insertion slot 122 such that when a piece of physical media, such as physical media 230, is inserted into the insertion slot 122, the physical media 230 slides towards the stopping panel 234 in the direction illustrated by arrow 290. In this regard, the platform 201 may be positioned such that it is on an angle relative to the insertion slot 122, as illustrated in FIG. 3. The stopping panel 234 may prevent the physical media 230 from sliding off of the platform 201. The platform 201 may include side walls 210, 211 for containing the physical media 230 on the platform 201, as further shown in FIG. 2. Although not shown, the platform 201 may also include a top that may form an enclosure with the side walls 210, 211 and platform base 213.

The interior of the validation and tracking device 101 may also include one or more imaging devices, such as imaging devices 240 and 242. Imaging device 240 may be any device configured to read identification information, such as one or more of barcodes, QR codes, RFID tags, etc. In the example shown in FIG. 2, imaging device 240 may be a scanner configured to read barcode 232 on physical media 230. The physical media inserted into the validation and tracking device may include identification information to allow for tracking and logging, as described herein.

Imaging device 242 may be a camera configured to capture images of the physical media 230 and/or identification information. Although scanner 240 and camera 242 are shown as separate imaging devices in FIG. 2, they may be the same device. For instance, camera 242 may capture image data that includes identification information, such as barcode 232. The camera or a controller, described herein, may determine the identification information from the image data.

Although FIG. 2 illustrates the imaging devices 240, 242 as being positioned on opposite sides of the platform 201, the imaging devices 240, 242 may be positioned anywhere within the interior of the validation and tracking device 101 that allows for images of the physical media inside of the validation and tracking device 101 to be captured. Captured images may be stored on the imaging devices 240, 242 and/or transferred to other components of the validation and tracking device, as described herein. In some instances, there may be more than two imaging devices. For instance, two, three, four, or more cameras 242 may be positioned around the platform 201, such as on the sides, above, and below the platform to capture images of the physical media positioned thereon from multiple directions. Similarly, the scanner 240 may be positioned to capture identification information on the physical media regardless of the direction the physical media is inserted into the validation and tracking device 101. For instance, scanner 240 may be positioned above the platform and another scanner may be positioned below the platform. In this regard, regardless of which surface the physical media 230 is positioned on the platform 201 the scanners may capture the identification information 232.

The platform 201 may be positioned above chutes for transporting the physical media 230. For example, and as shown in the side cut-away view of the destruction validation system 100 of FIG. 3, the ejection chute 123 is positioned within the interior of the validation and tracking device 101 below the platform and near the insertion slot 122. The ejection chute 123 extends out of the base 153 of the validation and tracking device 101 and terminates into collection bin 124. Although ejection chute 123 is shown as extending out of the base 153 of the validation and tracking device 101, the ejection chute 123 may extend out of any portion of the validation and tracking device 101 or destruction device 103.

Transportation chute 323 is positioned near the back of the platform 201 away from the insertion slot 122, behind stopping panel 234. The transportation chute extends beyond the base of the validation and tracking device 101 into the destruction device 103. The transportation chute terminates into the destruction unit 324 of the destruction device 103. Although ejection chute 123 and transportation chute 323 are shown as being a singular piece, they may include many pieces. For example, transportation chute 323 may have a first piece in the validation and tracking device 101 and a second piece in the destruction device 103. The second piece may align with the first piece to allow physical media to pass from the validation and tracking device 101 to the destruction device 103. Further, the arrangement of the ejection chute 123 and transportation chute 323 are merely for illustrative purposes. The chutes may include different configurations based on where the destruction device 103 and collection bin 124 are positioned relative to the platform 201.

Figure 4:
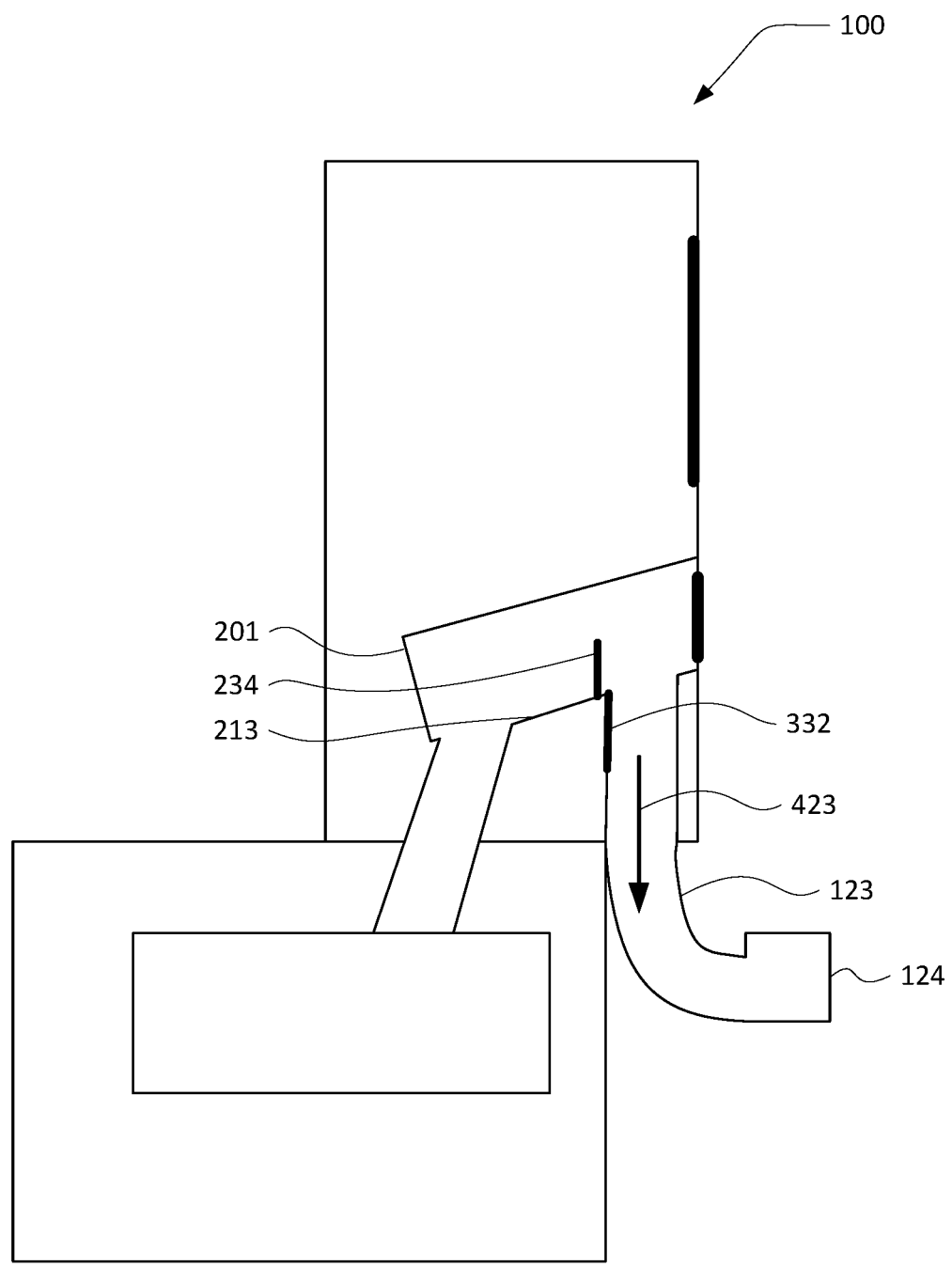
FIG. 4 shows the operation of a drop panel in accordance with aspects of the disclosure.

Panels, including stopping panel 234 and drop panel 332 shown in FIG. 3, may control the path of movement of the physical media 230 through the validation and tracking device 101. For instance, and as illustrated in FIG. 4, when the validation and tracking device 101 rejects a piece of physical media, such as physical media 230, a drive unit or units (not shown), such as servo motors, actuators including screw and belt driven actuators, or other such devices capable of controlling movements, may rotate the drop panel 332 such that an opening is formed in the platform base 213 of the platform 201. Stopping panel 234 may remain stationary to prevent the physical media 230 from sliding away from the opening. Although FIG. 4 illustrates the drop panel 332 rotating downward in the direction of arrow 423, the drop panel 332 may rotate and/or translate in other directions to create the opening in the platform base 213. For instance, the drive unit may cause drop panel 332 to slide along the platform base 213.

As a result of the drop panel 332 rotating, the physical media 230 may drop in the direction of arrow 423 through the opening into the ejection chute 123. Physical media 230 may travel through the ejection chute to collection bin 124, where it may be retrieved by an operator.

Figure 5:
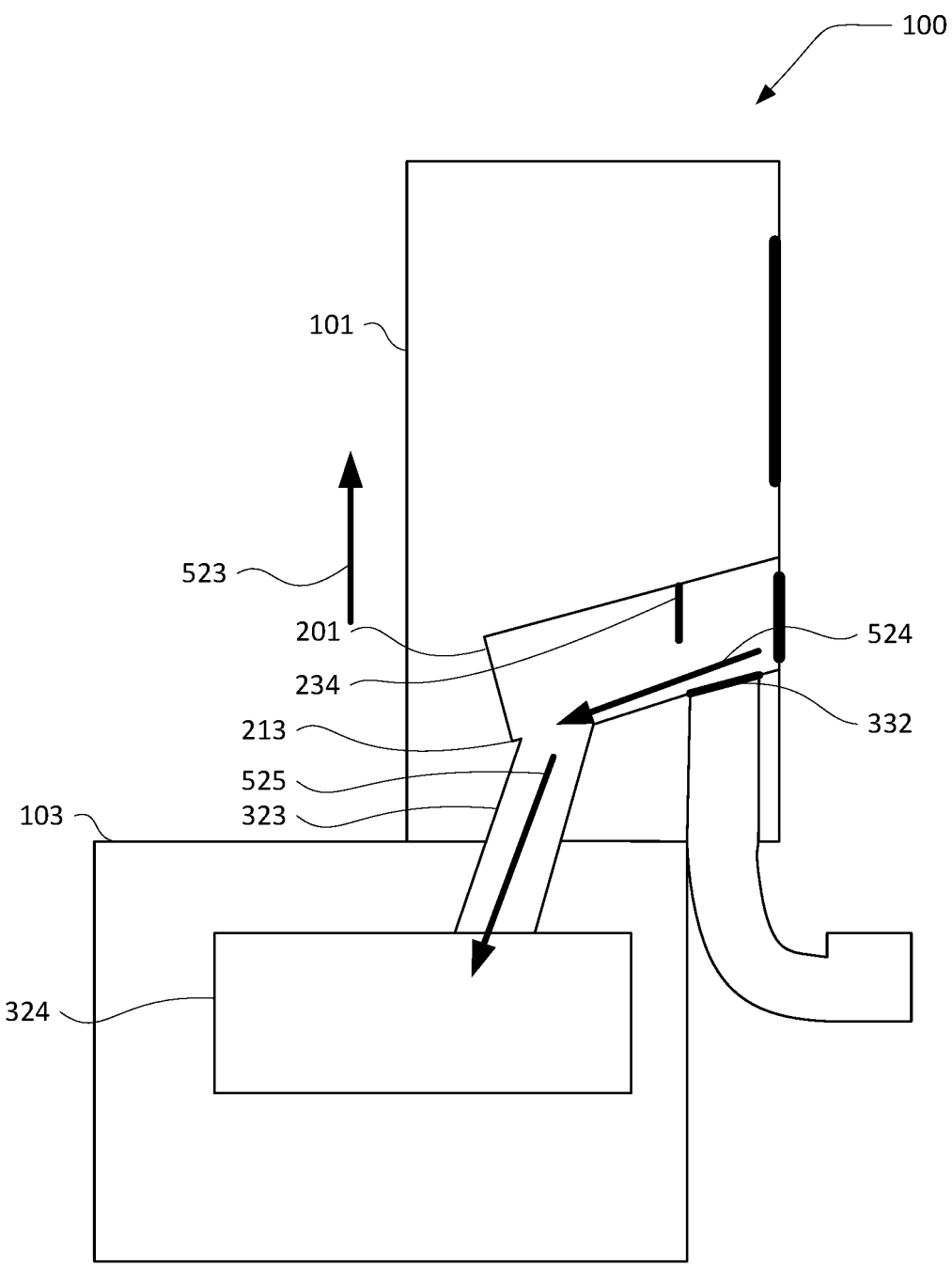
FIG. 5 shows the operation of a stopping panel in accordance with aspects of the disclosure.

FIG. 5 illustrates the operation of the panels, including stopping panel 234, when the physical media, such as physical media 230, is released for destruction. In this regard, a drive unit or units (not shown) may cause the stopping panel 234 to lift away from the platform base 213 in the direction of arrow 523. Drop panel 332 may remain stationary to prevent the physical media 230 from entering the ejection chute 123. Although FIG. 5A illustrates the stopping panel 234 lifting away in the direction of arrow 523, the stopping panel 234 may rotate and/or translate in other directions As a result of the stopping panel 234 lifting away, the physical media 230 may slide along the platform base 213 in the direction of arrow 524 and subsequently drop into the transportation chute 323. The physical media 230 may travel through the transportation chute 323 in the direction of arrow 525 to the destruction unit 324 of destruction device 103.

Figure 6A:
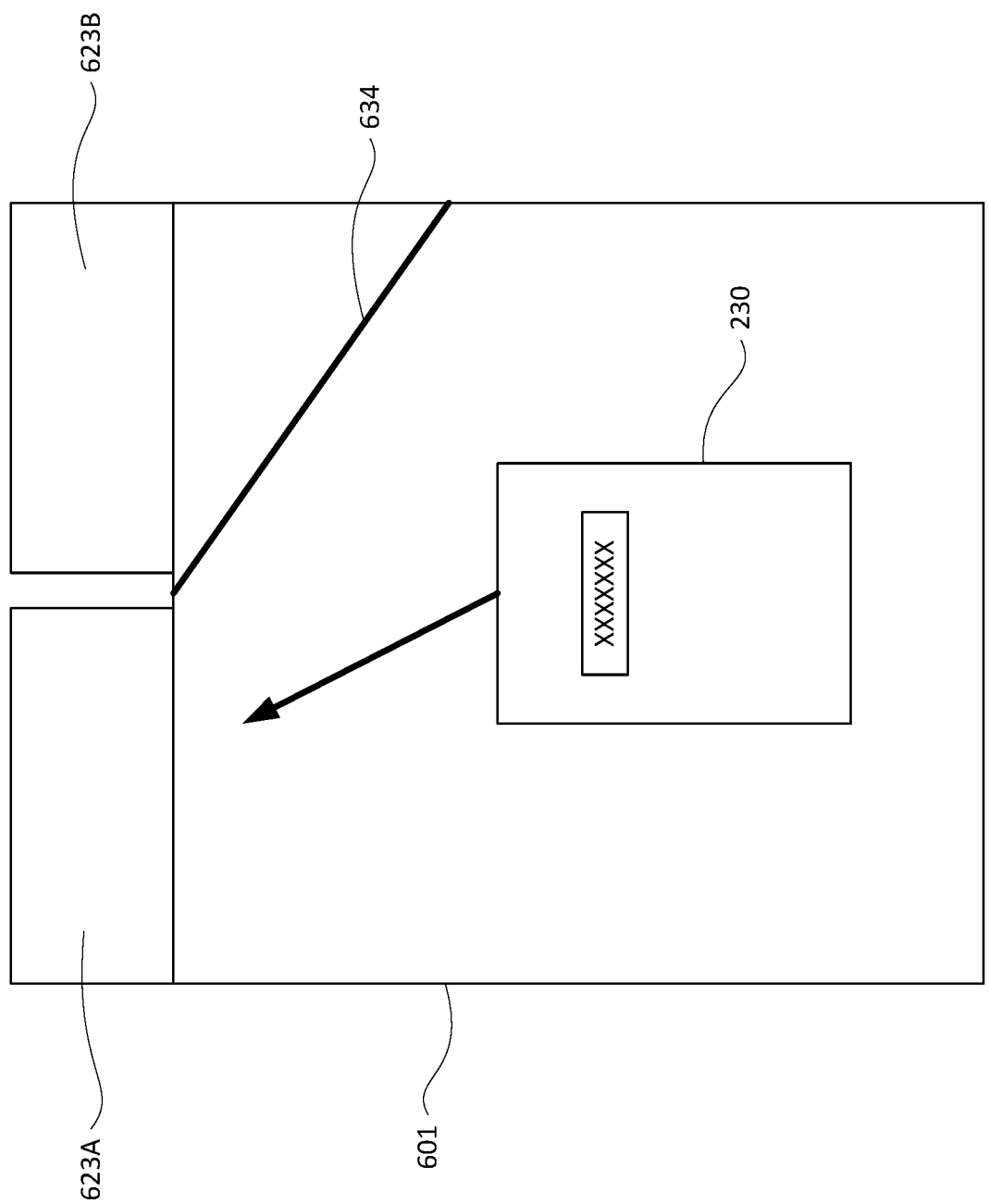
FIGS. 6A and 6B show the operation of a directional panel in accordance with aspects of the disclosure.
Figure 6B:
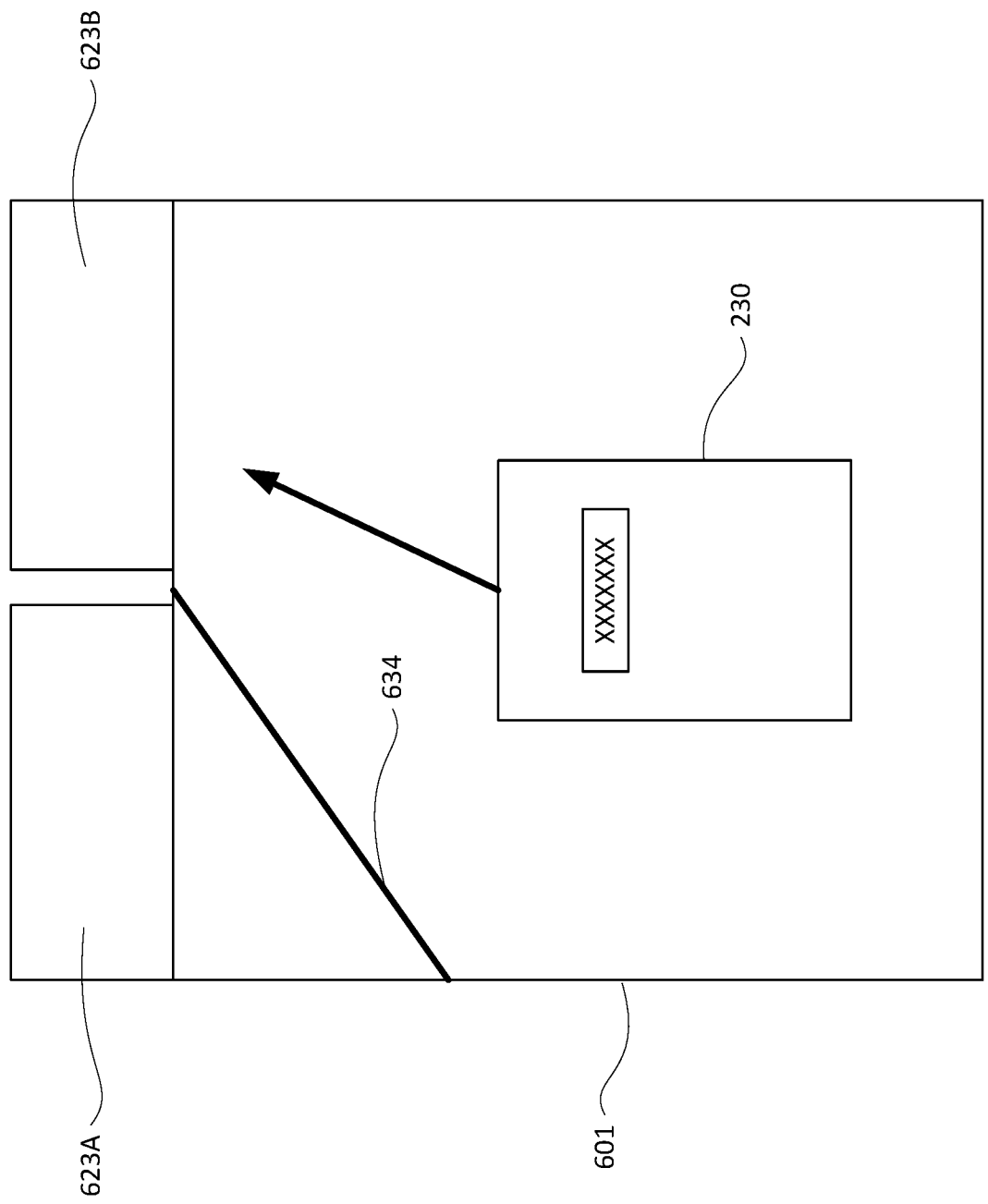

In some instances, the destruction device may have separate destruction units for different types of physical media. For instance, a destruction device may have a destruction unit for platter-based hard drives and another destruction unit for solid state hard drives. Separate transportation chutes may be provided from the platform 201 to each destruction unit. For instance, and as shown in FIGS. 6A and 6B, platform 601 may include a directional panel 634 that directs physical media 230 to one of two transportation chutes 623A and 623B. Depending on the type of physical media 230 is, the directional panel 634 may be positioned to direct the physical media 230 to a particular chute. In the example of FIG. 6A, transportation chute 623A may connect to a destruction unit for platter-based hard drives and transportation chute 623B may connect to a destruction unit for solid state hard drives. When the directional panel 634 is in the position shown in FIG. 6A, the physical media 230 may be directed to transportation chute 623A. When the directional panel 634 is in the position shown in FIG. 6B, the physical media 230 may be directed to transportation chute 623B. The position of the direction panel 634 may be controlled by one or more drive units. In some instances, there may be more than two transportation chutes and more than one directional panel.

Referring back to FIG. 3, the destruction device 103 may be a shredding machine, a punching machine, a crushing machine, or any other device capable of destroying physical media such that the data stored thereon is irretrievable and incapable of being recreated. The destruction unit 324 may include the components of the destruction device 103 that physically destroy pieces of physical media, such as physical media 230.

Figure 7:
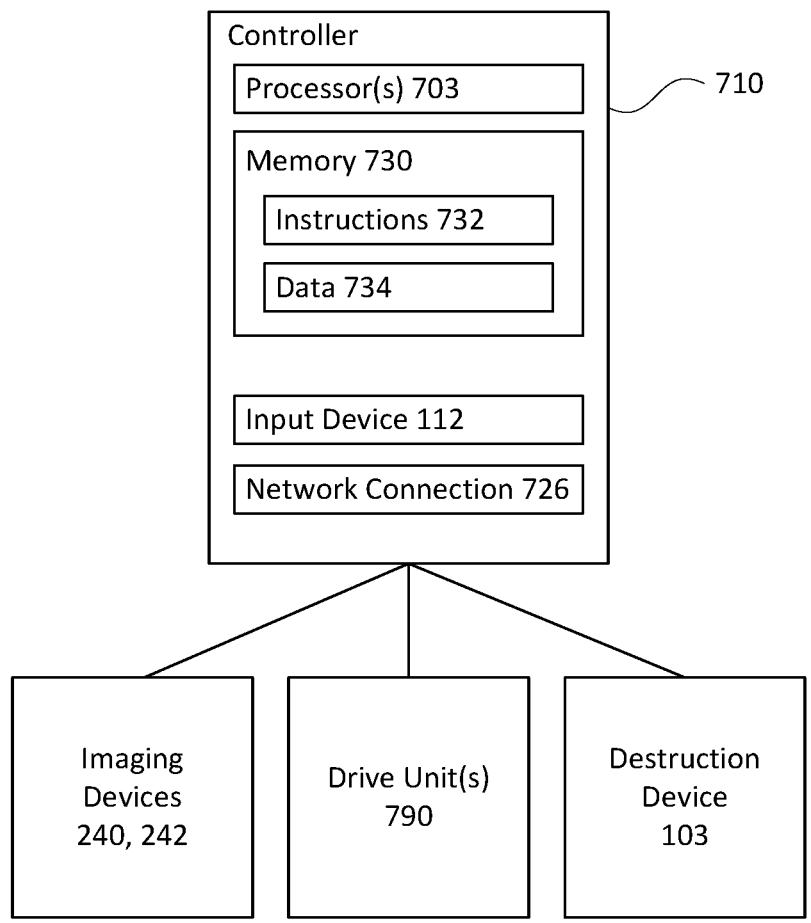
FIG. 7 shows a block diagram of an insertion controller in accordance with aspects of the disclosure.

The operation of the destruction validation system 100 may be controlled by a controller 710, shown in FIG. 7. The controller 710 may include a processor 703 and memory 730. The processor may be any conventional processor, such as processors from Intel Corporation or Advanced Micro Devices. Alternatively, the processor may be a dedicated controller such as an application specific integrated circuit (ASIC), field programmable gate array (FPGA), etc. Additionally, the processor 703 may include multiple processors, multi-core processors, or a combination thereof. Although only one processor 703 is shown in FIG. 7, one of ordinary skill in the art would recognize that several processors may exist within controller 710. Accordingly, references to a processor will be understood to include references to a collection of processors or dedicated logic that may or may not operate in parallel.

The memory 730 stores information accessible by the one or more processors 403, including instructions 732 and data 734 that may be executed or otherwise used by the processor 403. The memory 730 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 732 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 734 may be retrieved, stored or modified by processor 403 in accordance with the instructions 732. For instance, although the claimed subject matter is not limited by any particular data structure, the data may be stored in computing device registers, in a relational database as a table having a plurality of different fields and records, XML documents or flat files. The data may also be formatted in any computing device-readable format.

The controller 710 may include all of the components normally used in connection with a computing device such as the processor and memory described above as well as an input device 112 (e.g., a mouse, keyboard, touch screen, buttons, and/or microphone) and/or various electronic displays (e.g., a monitor having a screen or any other electrical device that is operable to display information). In this example, the controller includes a touch-screen display, which functions as an input device 112. The input device 112 may be used to receive inputs from an operator, such as confirmation that a piece of physical media may be destroyed, the type of physical media being destroyed, etc. The input device 112 may also provide information regarding the piece of physical media the operator and operation of the destruction validation system 100, such as failure to identify physical media inserted, failure of destruction, etc. The input device 112 may further provide requests for instructions, such as an option to continue with destruction of physical media when not properly identified, confirming the destruction of the physical media should proceed. An operator may also request a piece of physical media be returned after insertion into the destruction validation system 100. In some instances, information may be provided to the operator by a display device, separate from the input device. Moreover, there may be more than one display devices and/or input devices.

The controller 710 may also include one or more network connections 726 to facilitate communication with other computing and storage devices. The network connections 726 may include wired or wireless communication protocols, such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, Wi-Fi and HTTP, and various combinations of the foregoing.

The controller 710 may store in memory 730 data such as current profiles of the destruction device 103. As previously described, during destruction of a piece of physical media, the destruction device 103 may require more current to operate. A current profile includes a current spike and/or pattern of current usage required by the destruction device 103 to destroy each type of physical media, such as hard drives, solid state hard drives, compact discs, memory modules, etc. In this regard, the amount of current drawn during destruction of each type of physical media may be different. For instance, the current required to destroy a memory module may be less than required to destroy a solid-state hard drive. In an example, the current profile for a particular piece of physical media may cause the destruction device 103 to have a current spike of a particular value and require certain amounts of current at particular times, which create a pattern of current. The current spike, pattern of current used, or both may be considered part of a current profile for the particular piece of physical media. Additionally, the current profile may include time information related to the destruction of the particular type of physical media. For instance, a destruction device may start destruction at a certain time after the physical media is released for destruction and another time at the end of the destruction. This time information may be included in the current profile, or stored elsewhere.

In some instances, current profiles for multiple destruction devices may be stored. For example, a validation and tracking device 101 housing controller 710 capable of operating with many different models of destruction devices may include current profiles corresponding to all compatible destruction devices.

The controller may also store in memory 730 data such as destruction logs, including data such as: physical media identification information, timestamp of captured image, timestamp of destruction start, timestamp of destruction stop, current profile, current spike timestamp, type of physical media, images of the physical media, confirmation of destructions, errors, etc. A destruction manifest may also be stored in memory 730. The destruction manifest may identify physical media approved for destruction, and in some instances, information related to the physical media approved for destruction. In some instances, the controller 710 may retrieve the destruction manifest, or other information identifying physical media approved for destruction, from another computing device through a network connection. In some instances, the current profiles, destruction logs, destruction manifest, etc., may be retrieved by the controller 710 from another storage device, such as a networked attached storage device.

As further shown in FIG. 7, the controller 710 may be configured to communicate with imaging devices 240, 242. In this regard, the controller may control operation of the imaging devices, such as by instructing the imaging devices to capture images when the validation and tracking device 101 receives a piece of physical media. The controller 710 may receive the captured image data and determine information about the piece of physical media, such as identification information, the type of media, etc.

The controller 710 may be configured to communicate with the drive units 790 to control the positioning of the various panels, including panels 234, 332, and 634. For example, when a piece of physical media, such as physical media 230 is approved for destruction, the controller 710 may instruct a drive unit 790 to move stopping panel 234 as illustrated in FIG. 5. In another example, when physical media 230 is rejected for destruction, or an operator requests the return of physical media 230, such as through the input device 112, the controller 710 may instruct a drive unit 790 to rotate drop panel 332, as illustrated in FIG. 4.

The controller 710 may also be configured to communicate with the destruction device 103, as further shown in FIG. 7. As described herein, the validation and tracking device 101 may be separate from the destruction device 103. In such instances, the validation and tracking device 101 may be configured to connect with the destruction device 103 such that the controller 710 can control the operation of the destruction device, including starting and stopping destruction units, such as destruction unit 324. The controller 710 may also receive information from the destruction device 103, including information from current sensing devices, such as current sensing device 143.

The destruction validation system may be secured such that unauthorized access is prevented. In this regard, access to the interior of the destruction validation system 100 may be limited to those with only specific tools and/or keys.

In addition to the operations described above and illustrated in the figures, various operations will now be described. The following operations do not have to be performed in the precise order described below. Rather, various steps can be handled in a different order or simultaneously, and steps may also be added or omitted.

Figure 8:
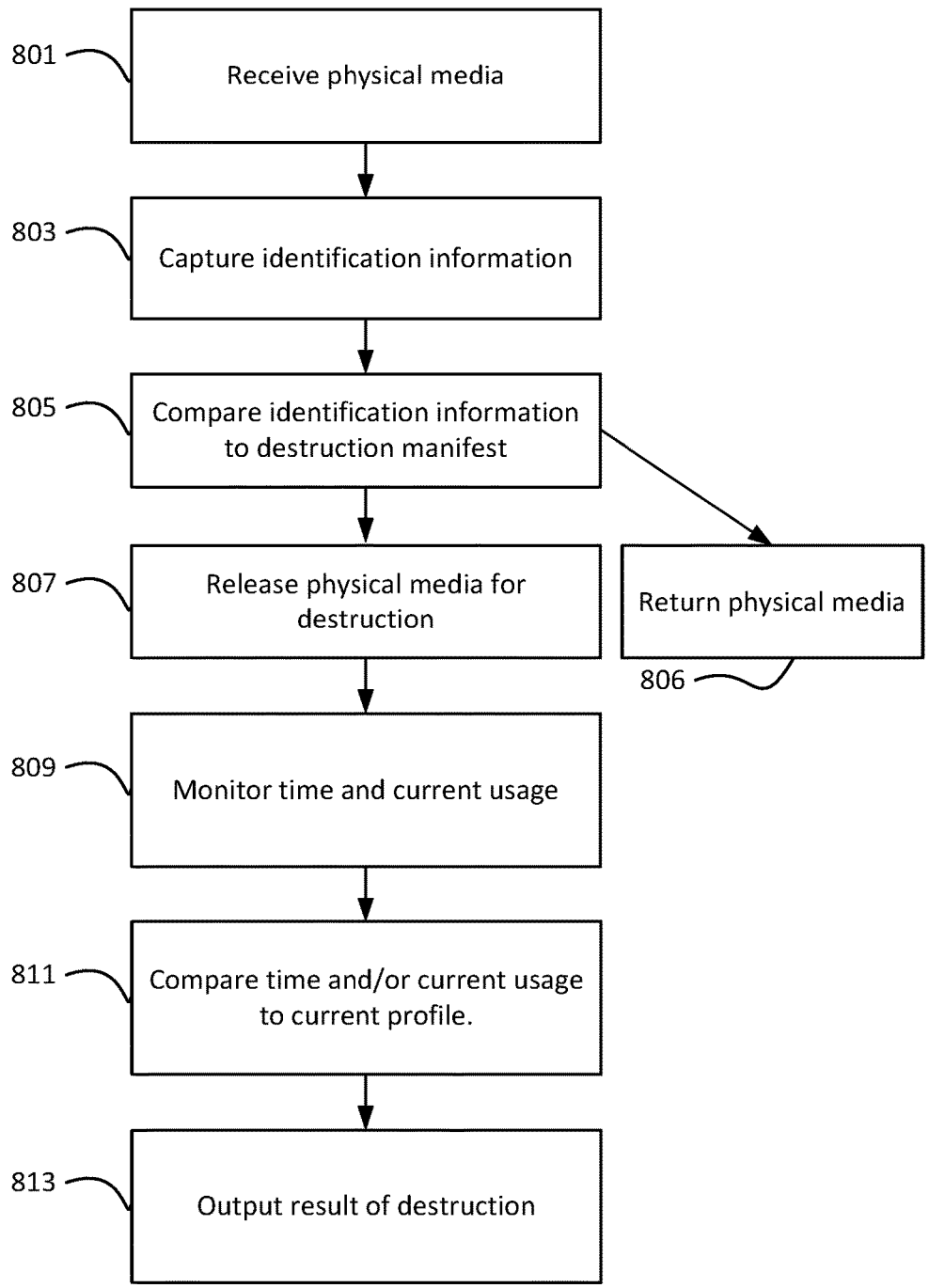
FIG. 8 is a flowchart in accordance with one aspect of the disclosure.

FIG. 8 illustrates a flow chart 800 showing an example destruction process using the destruction validation system 100. As shown in block 801, a piece of physical media, such as physical media 230, is received in the validation and tracking device 101. The physical media 230 may be positioned on the platform 201 in the validation and tracking device 101. Imaging devices 240, 242 may capture identification information, such as identification information 232, positioned on the piece of physical media 230, as shown in block 803.

The identification information 232 may be compared to a destruction manifest to determine whether the physical media 230 may be destroyed, as shown in block 805. In the event the physical media 230 is approved for destruction, the physical media 230 may be released from the platform 201 to the destruction device, such as destruction device 103, as shown in block 807. In the event the physical media 230 is not approved for destruction, the physical media 230 may be released from the platform 201 and returned to the operator or location outside of the destruction validation system, as shown in block 806.

When the physical media 230 is released for destruction a controller, such as controller 710 may monitor the time from release to the start and stop of the destruction device 103. The controller 710 may also monitor current usage of the destruction device 103, as shown in block 809. The controller 710 may compare the time and/or current usage to a current profile, as shown in block 811. When the time and/or current usage match the current profile, the result of the destruction may be confirmed. When the time and/or current usage do not match the current profile, the result of the destruction may not be confirmed. The result may be output, such as to a display, as shown in block 813.

By using the destruction validation system 100 and the methodologies described herein, destruction of a piece of physical media can be achieved with high confidence.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A destruction validation system comprising:
    a destruction device comprising a first destruction unit configured to destroy a first type of physical media and a second destruction unit configured to destroy a second type of physical media;
    a directional panel configured to selectively direct a piece of physical media to the first destruction unit or the second destruction unit; and
    a controller, wherein the controller is configured to:
        monitor current drawn by the destruction device during destruction of the piece of physical media between a first time at a start of the destruction and a second time at an end of the destruction to develop a current profile;
        compare the developed current profile to at least one of a plurality of current profiles, wherein each of the plurality of current profiles corresponds to a type of the piece of physical media; and
        generate and output a first notification confirming the piece of physical media has been destroyed when the developed current profile matches with one of the plurality of current profiles corresponding to the type of the piece of physical media, or
        generate and output a second notification not confirming the piece of physical media has been destroyed when the developed current profile does not match with one of the plurality of current profiles corresponding to the type of the piece of physical media,
    wherein the piece of physical media includes a computer-readable data storage device.

2. The destruction validation system of claim 1, wherein the destruction device comprises one or more of a shredding machine, a punching machine, or a crushing machine.

3. The destruction validation system of claim 1, wherein the destruction device includes:
    a current sensing device, wherein the current sensing device is configured to:
        detect the current drawn by the destruction device, and
        transmit the detected current drawn to the controller, wherein the developed current profile is based on the detected current drawn.

4. The destruction validation system of claim 1, wherein the first or the second notification is further based on one or more of the first time or the second time.

5. The destruction validation system of claim 4, wherein the first notification indicates the piece of physical media has been destroyed when the start time and/or the end time of the destruction of the piece of physical media is within a predetermined time period.

6. The destruction validation system of claim 1, wherein at least one of the plurality of current profiles includes a current spike value.

7. The destruction validation system of claim 1, wherein at least one of the plurality of current profiles includes current values over a period of time.

8. The destruction validation system of claim 1, wherein the type of the piece of physical media includes one or more of a hard drive, a solid state hard drive, a memory module, or a disc.

9. The destruction validation system of claim 1, wherein the destruction validation system further includes:
    a validation and tracking device including a platform and one or more imaging devices.

10. The destruction validation system of claim 9, wherein the destruction validation system further includes a plurality of chutes for transporting the piece of physical media including:
- a first chute for transporting the piece of physical media to an exterior of the destruction validation system; and
- a second chute for transporting the piece of physical media to the destruction device.

11. The destruction validation system of claim 10, wherein the platform further includes a plurality of panels configured to direct the piece of physical media to one of the plurality of chutes.

12. The destruction validation system of claim 11, wherein the controller is further figured to:
- receive, from the one or more imaging devices, identification information of piece of physical media;
- compare the identification information of the piece of physical media to a destruction manifest; and
- determine, based on the comparison of the identification information to the destruction manifest, whether the piece of physical media is approved for destruction.

13. The destruction validation system of claim 12, wherein the controller is further configured to:
- upon determining the identification information of the piece of physical media matches a listed device on the destruction manifest, controlling positions of the plurality of panels to direct the piece of physical media to the second chute.

14. The destruction validation system of claim 12, wherein the controller is further configured to:
- upon determining the identification information of the piece of physical media does not match a listed device on the destruction manifest, controlling positions of the plurality of panels to direct the piece of physical media to the first chute.

15. The destruction validation system of claim 1, further comprising a display device, wherein the first or the second notification is displayed on the display.

16. A method for destroying a piece of physical media comprising:
- selectively directing the piece of physical media to one of a first destruction unit or a second destruction unit of a destruction device;
- monitoring, by a controller, current drawn by a destruction device during destruction of the piece of physical media between a first time at a start of the destruction and a second time at an end of the destruction to develop a current profile;
- comparing, by the controller, the developed current profile to at least one of a plurality of current profiles, wherein each of the plurality of current profiles corresponds to a type of the piece of physical media; and
- generating and outputting, by the controller, a first notification confirming the piece of physical media has been destroyed when the developed current profile matches with one of the plurality of current profiles corresponding to the type of the piece of physical media, or
- generating and outputting, by the controller, a second notification not confirming the piece of physical media has been destroyed when the developed current does not match with one of the current profiles corresponding to the type of the piece of physical media,
- wherein the piece of physical media includes a computer-readable data storage device.

17. The method of claim 16, wherein the first notification is further based on one or more of the first time or the second time, and the first time and/or the second time is within a predetermined time period.

18. The method of claim 16, wherein at least one of the plurality of current profiles includes a current spike value and/or current values over a period of time.

* * * * *